US009666309B2

(12) United States Patent
Kang et al.

(10) Patent No.: US 9,666,309 B2
(45) Date of Patent: May 30, 2017

(54) METHOD AND DEVICE FOR REPAIRING MEMORY

(71) Applicant: Industry-Academic Cooperation Foundation, Yonsei University, Seoul (KR)

(72) Inventors: Sungho Kang, Seoul (KR); Keewon Cho, Gyeonggi-do (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 24 days.

(21) Appl. No.: 14/479,657

(22) Filed: Sep. 8, 2014

(65) Prior Publication Data

US 2015/0071018 A1 Mar. 12, 2015

(30) Foreign Application Priority Data

Sep. 10, 2013 (KR) .................. 10-2013-0108582

(51) Int. Cl.
*G11C 29/00* (2006.01)

(52) U.S. Cl.
CPC .................. *G11C 29/808* (2013.01)

(58) Field of Classification Search
CPC .................................................. G11C 29/76
USPC .......................................................... 365/200
See application file for complete search history.

(56) References Cited

U.S. PATENT DOCUMENTS

| 4,627,053 | A | * | 12/1986 | Yamaki | G11C 29/72 |
| | | | | | 714/711 |
| 4,751,656 | A | * | 6/1988 | Conti | G11C 29/72 |
| | | | | | 714/711 |
| 5,867,435 | A | * | 2/1999 | Ogino | G11C 29/72 |
| | | | | | 365/189.05 |
| 6,067,259 | A | * | 5/2000 | Handa | G11C 29/808 |
| | | | | | 365/200 |
| 6,373,758 | B1 | * | 4/2002 | Hughes et al. | 365/200 |
| 6,795,942 | B1 | * | 9/2004 | Schwarz | 714/718 |
| 2007/0195618 | A1 | * | 8/2007 | Krech, Jr. | G01R 31/31926 |
| | | | | | 365/200 |
| 2009/0172483 | A1 | * | 7/2009 | Anzou | G11C 29/44 |
| | | | | | 714/723 |
| 2012/0131396 | A1 | * | 5/2012 | Jeong | G11C 29/4401 |
| | | | | | 714/718 |
| 2017/0011809 | A1 | * | 1/2017 | Yano | G11C 16/08 |

FOREIGN PATENT DOCUMENTS

| KR | 2001-0070155 A | 7/2001 |
| KR | 2001-0076937 A | 8/2001 |
| KR | 2011-0010381 A | 2/2011 |

(Continued)

OTHER PUBLICATIONS

S-Y. Kuo and W.K. Fuchs, "Efficient spare allocation in reconfigurable arrays", IEEE Design & Test, vol. 4, pp. 24-31, 1987.*

(Continued)

*Primary Examiner* — Anthan Tran
*Assistant Examiner* — Mushfique Siddique
(74) *Attorney, Agent, or Firm* — Carter, DeLuca, Farrell & Schmidt, LLP (57) ABSTRACT

Provided are a method and device for repairing memory. The method includes: determining spare lines with priority to be used for repair, and searching for a repair solution by using the spare line with priority and failure counters for lines without priority.

6 Claims, 10 Drawing Sheets

(56) References Cited

FOREIGN PATENT DOCUMENTS

KR     2012-0077285 A     7/2012
KR     2012-0129700 A     11/2012

OTHER PUBLICATIONS

Huang et al. ("Built-In Redundancy Analysis for Memory Yield Improvement", IEEE Transactions on Reliability, vol. 52, No. 4, Dec. 2003).*
Hyungjun Cho et al. ("A Very Efficient Redundancy Analysis Method Using Fault Grouping", ETRI Journal, vol. 35, No. 3, Jun. 2013).*
Kang et al., "The Efficient Memory BISR Architecture using Sign Bits," The Institute of Electronics and Information Engineers. 2007-44SD-12-13, Dec. 2007, pp. 85-92.
Kuo et al., "Efficient Spare Allocation for Reconfigurable Arrays," IEEE Design & Test, vol. 4, pp. 24-31, Feb. 1987.
Oehler et al., "An Integrated Built-in Test and Repair Approach for Memories with 2D Redundancy," in Proc. of European Test Symposium, IEEE Computer Society, pp. 91-96, Freiburg, Germany, May 2007.
Cho et al., "A Fast Redundancy Analysis Algorithm in ATE for Repairing Faulty Memories", ETRI Journal, vol. 34, No. 3, Jun. 2012, pp. 478-481.

* cited by examiner

|  | Column Address | | | | | | | C1 C2 C3 C4 |
|---|---|---|---|---|---|---|---|---|
|  | 0 | 1 | 2 | 3 | 4 | 5 | 6 | |
| R1 | × |  |  | × |  |  |  | |
| R2 |  |  |  | × |  |  |  | |
| 2 |  |  | × |  |  |  |  | |
| 3 |  | × |  |  |  |  |  | |
| 4 |  |  |  |  |  |  |  | |
| 5 |  | × |  |  | × | × |  | |
| 6 |  | × |  |  |  |  | × | |

| 0 | 3 | 1 | 0 | 1 | 1 | 1 |
|---|---|---|---|---|---|---|

Column Failure Counter

| 0 | 0 | 1 | 1 | 1 | 1 | 3 |
|---|---|---|---|---|---|---|

Alinged Column Failure Counter

METHOD AND DEVICE FOR REPAIRING MEMORY

CROSS-REFERENCE TO RELATED APPLICATIONS

This U.S. non-provisional patent application claims priority under 35 U.S.C. §119 of Korean Patent Application No. 10-2013-0108582, filed on Sep. 10, 2013, the entire contents of which are hereby incorporated by reference.

BACKGROUND OF THE INVENTION

The present invention disclosed herein relates to a method and device for repairing memory.

The development of a semiconductor process may increase the degree of integration in memory but also increase the probability of cell failure. Since the failure of a memory cell causes the reduction of a memory yield, a method for repairing the failure of a memory cell is suggested. Redundancy analysis (RA) means a method for preparing a spare memory for repairing the failure of a memory cell and replacing a failed memory cell. A good RA algorithm is required to derive a repair solution from a repairable circuit and have a short repair time. However, since finding a repair solution by disposing a two-dimensional spare memory in a failed memory cell is an NP-complete problem, as the size of a memory is greater, a repair time is increased rapidly. Therefore, a good RA algorithm is required to have a high repair efficiency and finish the repair with in a proper time.

Typically, a RA algorithm for repairing a line having a plurality of failures first in one line is mainly used for repair efficiency.

SUMMARY OF THE INVENTION

The present invention provides a memory repairing method for deriving a repair solution in a short time with high repair efficiency.

Embodiments of the present invention provide memory repairing methods include: determining spare lines with priority to be used for repair; and searching for a repair solution by using the spare line with priority and failure counters for lines without priority.

In other embodiments of the present invention, methods of repairing a memory cell array where the number of row spare memories is greater than the number of column spare memories include: searching for a repair solution by using the column spare lines and row failure counters; and terminating a repair solution search when the number of rows where the number of failures in the row failure counters is not 0 is less than or equal to the number of the row spare lines.

In still other embodiments of the present invention, methods of repairing a memory cell array where the number of column spare memories is greater than the number of row spare memories include: searching for a repair solution by using the row spare lines and column failure counters; and terminating a repair solution search when the number of columns where the number of failures is not 0 in the column failure counters is less than or equal to the number of column spare lines.

In yet other embodiments of the present invention, memory repairing devices include: a connection unit connected to memory cell array and reading information; a storage unit storing the read information; and a control unit repairing a failure of the memory cell array by using the information, wherein the control unit searches for a repair solution by using failure counters of a line having a larger value among the number of row spare lines and the number of column spare lines in the memory cell array and spare lines having a smaller value among the number of the row spare lines and the number of the column spare lines, and terminates a repair solution search when the number of lines where the number of failures is not 0 in the failure counters is less than or equal to a larger value among the number or the row spare lines and the number of the column spare lines.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The effects and features of the present invention and methods of achieving them will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Otherwise indicated herein, all the terms used herein, which include technical or scientific terms, may have the same meaning that is generally understood by a person skilled in the art. Terms defined by general dictionaries are interpreted as having the same meanings as that in related techniques and/or this specification and if not clearly defined, are not conceptualized or not be interpreted as being overly excessive.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

As used herein, the term and/or includes any and all combinations of one or more of the associated listed items.

The terms '~unit', 'device', '~block', or '~module' may mean a unit for processing at least one function or operation. For example, it may means a software component or a hardware component such as FPGA or ASIC. However, the term '~unit', 'device', '~block', or '~module' is not limited to software or hardware. '~unit', 'device', '~block', or '~module' may be configured to be stored on an addressable storage medium and may be configured to execute at least one processor. Accordingly, as one example, 'unit', 'device', 'block', or 'module' includes components (for example, software components, object-oriented software components, class components, and task components), processors, functions, attributes, procedures, subroutines, segments of program code, drivers, firmware, microcode, circuits, data, databases, data structures, tables, arrays, and variables. Functions provided in components and '~unit', 'device', '~block', or '~module' may be combined in the less number of the components and '~unit', 'device', '~block', or '~module' or may be separated in the more number of the components and '~unit', 'device', '~block', or '~module'.

The present invention searches for a repair solution by using one of two kinds of spare lines (i.e., row spare lines of memories and column spare lines of memories) as compared to a conventional repair solution which searches for a repair solution by using simultaneously row spare lines and column spare lines. A priority determination or selection is performed in the present invention. A priority determination or selection in the present invention may mean determining which one of two kinds of spare lines is used firstly in memory sparing. In an example, spare lines which have relatively less number of lines are selected firstly for memory sparing. If the row spare lines have less number of lines than the column spare lines, the row spare lines are selected firstly for memory sparing. In this case row line (e.g., row spare line, row memory line) may be referred to as priority line or line with priority and column line may be referred to as non-priority line or line without priority. Also, a repair solution search is performed by using failure counters for non-priority lines and the spare lines with priority. Failure counter may indicate the number of failure memory cells in respective memory lines. For example, column failure counters may indicate the number of failure memory cells in respective memory lines. Likewise row failure counters may indicate the number of failure memory cells in respective row lines.

If it is assumed that column spare lines are selected firstly and the number of row spare lines is N, failures in the N row memory lines may be repaired 100% in the row failure counters by using the N number of row spare lines. Accordingly, if a partial repair solution for allowing the number of rows with a failure number to be less than or equal to N in the row failure counter by using the M number of column spare lines is found, a repair solution search may be terminated.

Accordingly, the present invention provides a repair solution for allowing the number of lines with a failure to be equal to or less than the number of spare lines without priority by using spare lines with priority and failure counters for non-priority lines. Compare to that the height of a tree structure based on a typically used complete enumeration survey is (the number of row spare lines+the number of column spare lines), the height of a search tree according to an embodiment of the present invention depends on Min (the number of spare lines, the number of column spare lines). As a result, a repair solution may be derived faster than before.

According to the present invention, row failure counters means counters recording the number of failures in respective row memory line; and column failure counters means counters recording the number of failures in respective column memory line.

Hereinafter, embodiments of the present invention will be described in more detail with reference to the accompanying drawings.

Figure 1:
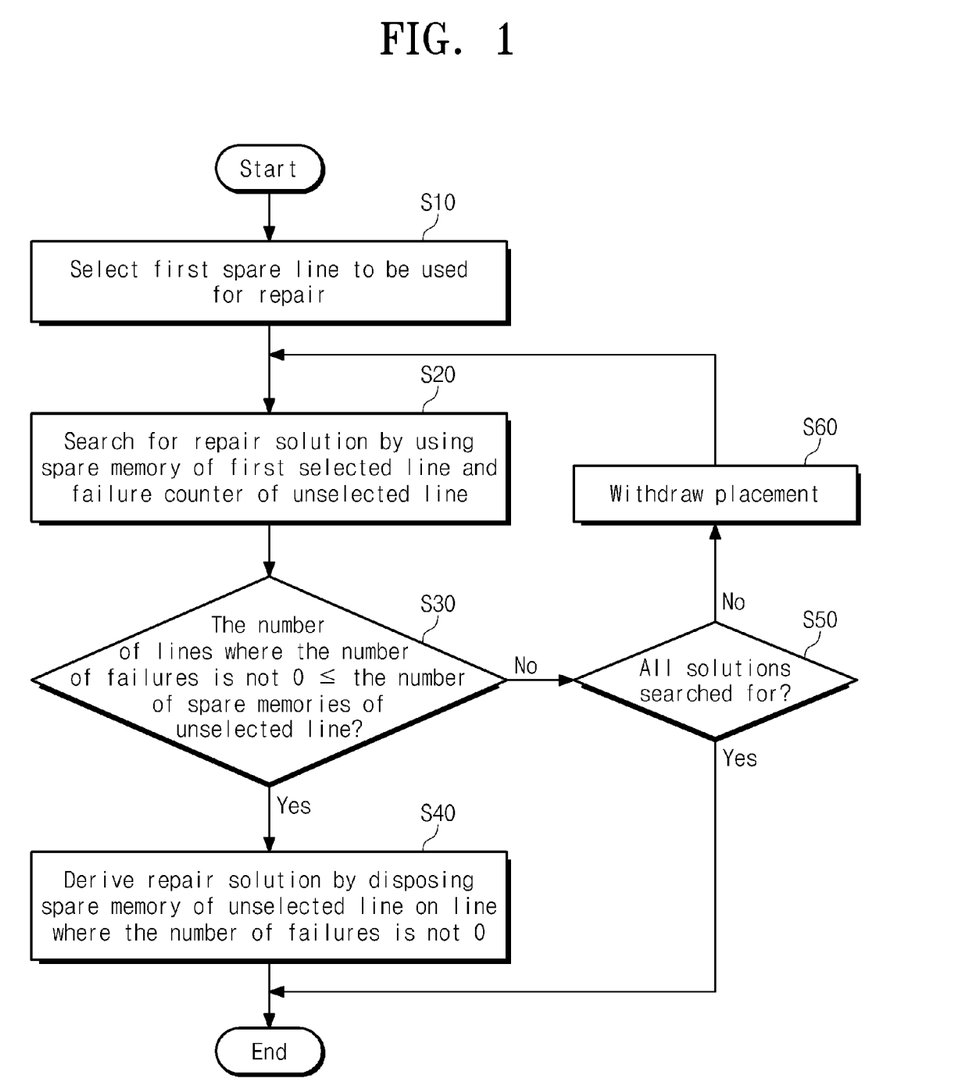
FIG. 1 is a view illustrating a memory repairing method according to an embodiment of the present invention.

FIG. 1 is a view illustrating a memory repairing method according to an embodiment of the present invention.

The memory repairing method includes priority selecting a spare line to be used for repair in operation S10, searching for a repair solution by using the spare lines with priority and failure counters for non-priority lines in operation S20, and terminating a repair solution search when the number of the failure counters with non-zero value for memory failures is less than or equal to the number of spare lines without priority in operation S30. The memory repairing method may further include deriving a repair solution by associating the spare lines of without priority with the lines with non-zero memory failure in operation S40, determining whether all repair solutions are found in operation S50, and withdrawing the associating decision when all repair solutions are not found in operation S60.

The priority selecting the spare line to be used for repair in operation S10 may be performed by comparing the number of row spare lines and the number of column spare lines. In more detail, spare lines having the less number of lines are selected firstly for memory repairing.

The searching for the repair solution by using the spare lines with priority (the priority spare lines) and the failure counters for non-priority lines in operation S20 may be performed as memory lines of memory cell array are replaced with the priority spare lines. Each time the memory lines of memory cell array are replaced with the priority spare lines, the failure counters for non-priority lines are updated. A process for updating the failure counters is described in more detail with reference to FIGS. 2 and 3.

The memory repairing method may perform the terminating of the repair solution search in operation S30 or the withdrawing of associating the spare lines in operation S60 according to an update result of the failure counters and may search for another repair solution through the re-associating the spare lines.

The deriving of the repair solution in operation S40 may repair the 100% remaining failures by using the spare lines with non-priority when the number memory lines having non-zero memory failure in the non-priority lines is less than or equal to the number of spare lines without priority. Since the spare lines without priority are associated with the remaining failures, a repair solution may be derived.

The deriving of the repair solution in operation S40, the determining whether all repair solutions are found in operation S50, and the withdrawing of associating the spare lines in operation S60 are described in more detail with reference to FIGS. 5 to 11.

Figure 2:
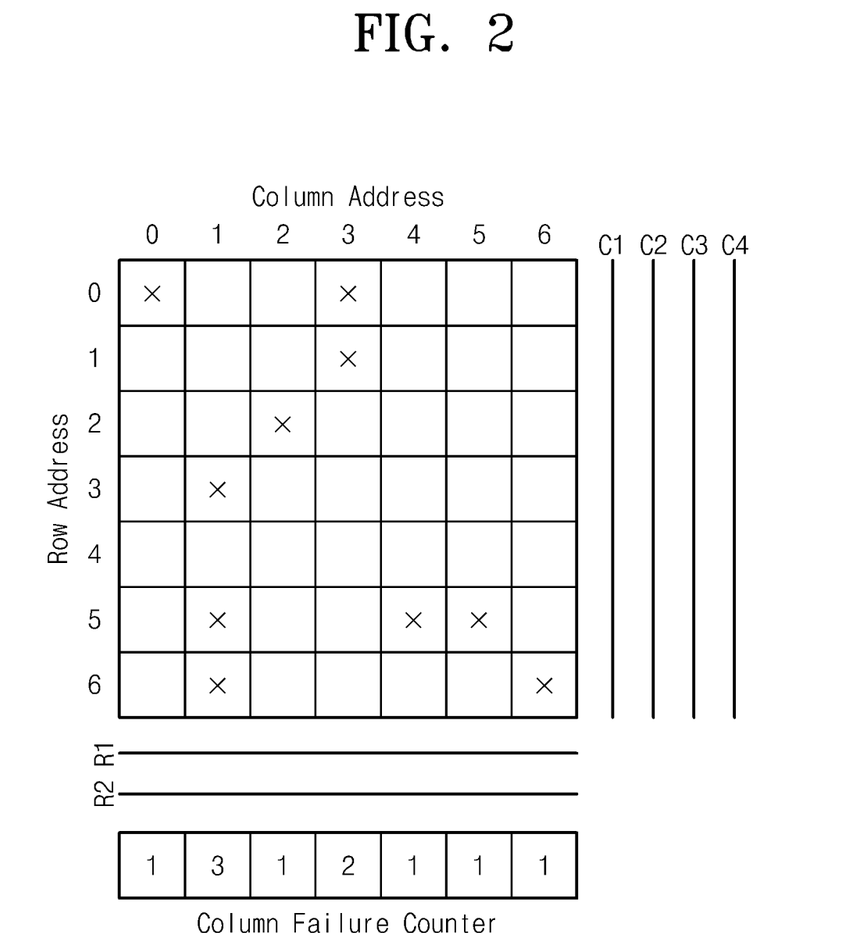
FIG. 2 is a view illustrating a failure memory to describe a memory repairing method according to an embodiment of the present invention.

FIG. 2 is a view illustrating a failure memory to describe a memory repairing method according to an embodiment of the present invention.

A memory cell array of FIG. 2 for example includes 7 row memory lines and 7 column memory lines (7×7 memory lines). Two row spare lines R1 and R2 and four column spare lines C1, C2, C3, and C4 are provided for repairing memory failures in the 7×7 memory lines of the memory cell array. Further, column failure counters and row failure counters (not shown) are provided to indicate and update the number of memory failure in respective memory lines. For example, the column failure counters may indicate and/or record the number of memory failure of the respective column memory line in the memory cell array. Likewise, the row failure counters may indicate and/or record the number of memory failure of the respective row memory line in the memory cell array. The memory cell array for example may have memory failures in (0,0), (0,3), (1,3), (2,2), (3,1), (5,1), (5,4), (5,5), (6,1), and (6,6) as represented by X.

In the memory repairing method according to an embodiment of the present invention, spare lines having relatively less number of lines may be selected firstly for memory repairing. In FIG. 2, since the number of row spare lines is 2 (i.e., R1 and R2) and the number of column spare lines is 4 (i.e., C1 to C4), row spare lines are selected firstly. In other words, row spare lines have priority when repairing memory cells. Once the row spare lines are selected first, a partial repair solution is searched for by using failure counters for the non-priority lines, that is, the column failure counters and row spare lines with priority.

Figure 3:
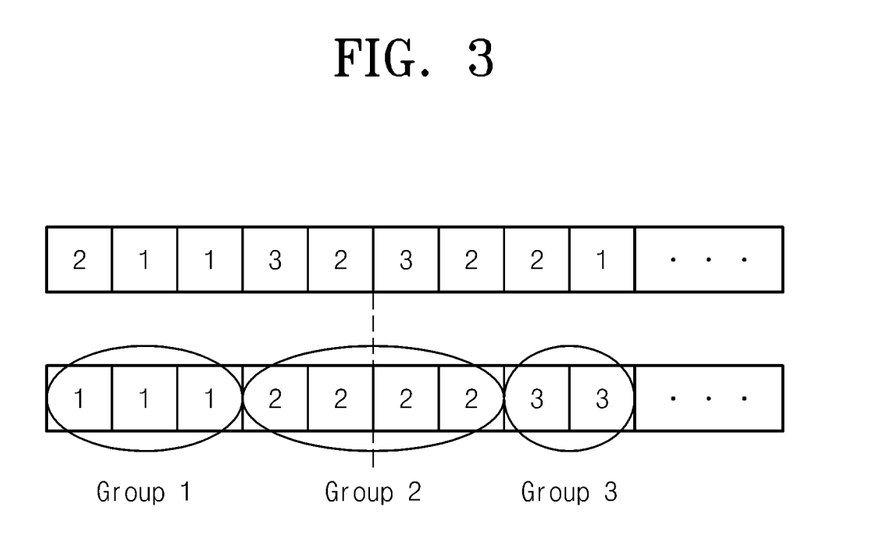
FIGS. 3 and 4 are views illustrating a method of aligning a failure counter and a method of grouping failures in a memory repairing method according to an embodiment of the present invention.
Figure 4:
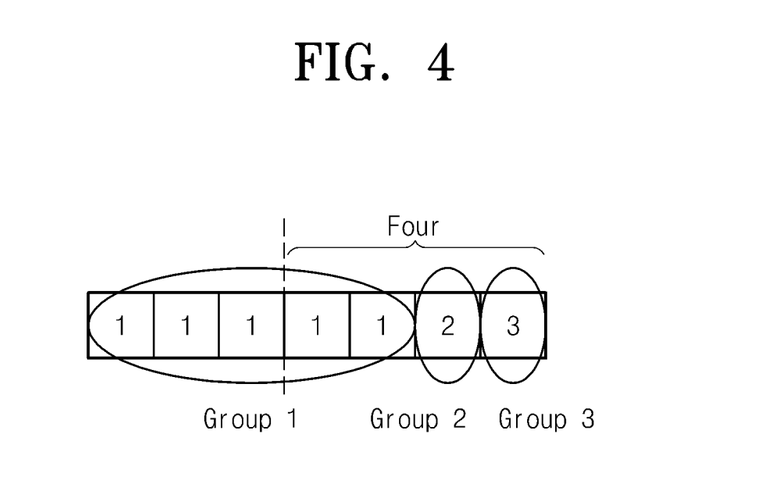

FIGS. 3 and 4 are views illustrating a method of aligning failure counters and a method of grouping failures in a memory repairing method according to an embodiment of the present invention.

The failure counter at the top of FIG. 3 represents failure counters before alignment and the failure counters at the bottom of FIG. 3 represents aligned failure counters. According to an embodiment of the present invention, the alignment of the failure counters may be aligned in ascending or descending order.

According to an embodiment of the present invention, when an alignment is completed, failure memory lines may be grouped according to the number of failures for each line. According to an embodiment of the present invention, fail memory lines with n number of memory failures may be included in a group n.

FIG. 4 is a view when the column failure counters of FIG. 2 are aligned. In the memory cell array of FIG. 2, since the number of row spare lines is 2 and the number of column spare lines is 4, row line are selected firstly (priority is given to the row spare lines) and a repair solution is searched for by using the column failure counters.

One spare line of the priority spare lines may allow the number of failures of some or all of lines included in the group 1 to be 0 in the failure counters for non-priority lines. Since the column failure counters represent and/or record the number of failures included in respective column lines, row spare lines may allow the number of failures of entire lines included in the group 1 to be 0 when failures of the lines belonging to the group 1 are included in the same row, and may allow the number of failures of one line to be 0 when the failures are included in different rows one another.

On the other hand, one spare line of non-priority spare line may allow only the one line among lines to 0 regardless of a group in the failure counters for the non-priority lines. That is, since the column failure counters represent the number of failures in respective column lines, when a failure is repaired by using one column spare line, all failures in one column memory line may be repaired.

Accordingly, since a failure in one line without priority is 100% repairable by one spare line without priority regardless of the number of failures, if a partial repair solution for allowing the number of lines where the number of failures in the failure counters for the non-priority lines is not 0 (non-zero) to be equal to or less than the number of spare lines without priory is found by the spare lines with priority, a repair solution for an entire memory array may be derived.

FIGS. 5 to 11 are views illustrating a process for applying a memory repairing method according to an embodiment of the present invention. Although it is assumed that the number of row spare lines is less than the number of column spare lines in FIGS. 5 to 11, the case that the number of row spare lines is greater than the number of column spare lines also belongs to the scope of the present invention.

Figure 5:
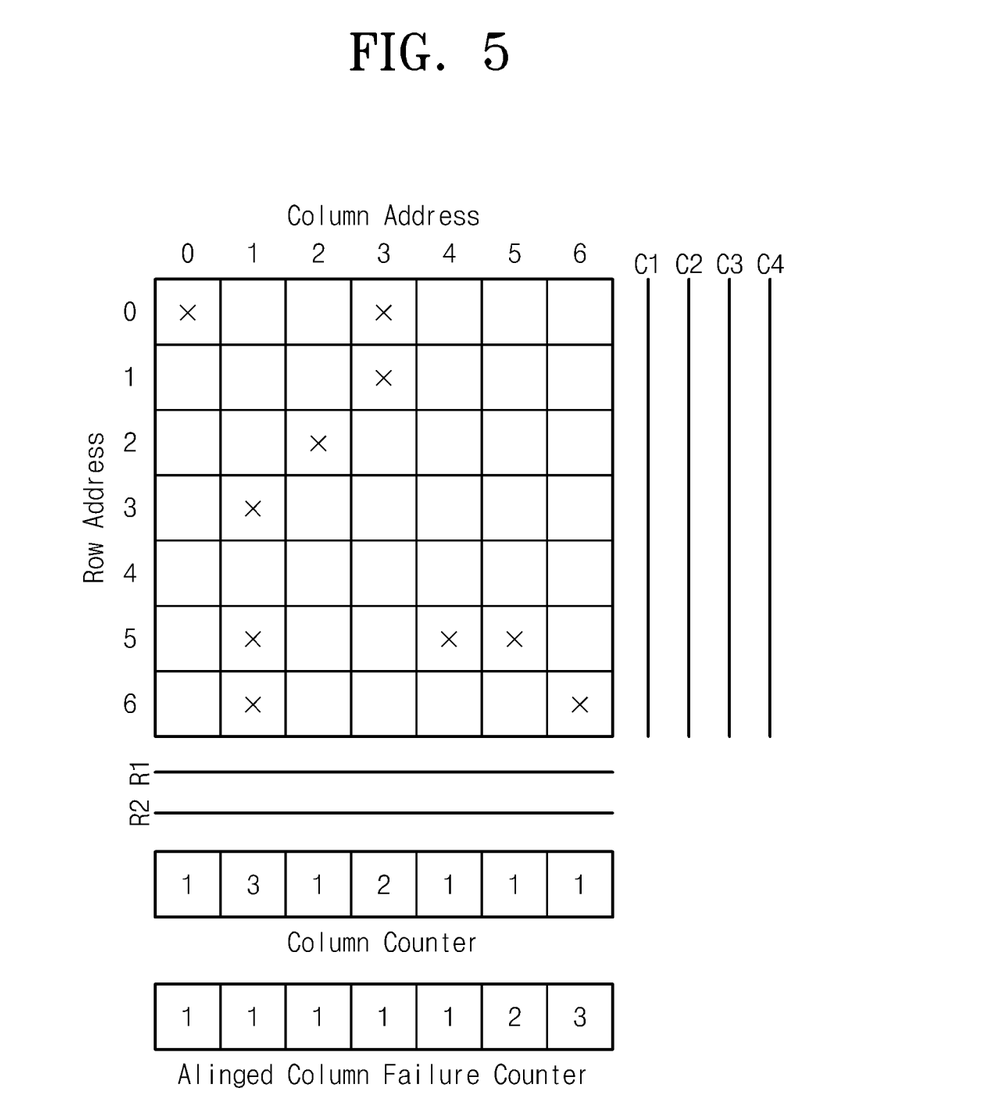
FIGS. 5 to 11 are views illustrating a process for applying a memory repairing method according to an embodiment of the present invention.

Referring to FIG. 5, a memory cell array, two row spare lines, four column spare lines, column failure counters, and aligned column failure counters are shown. The memory cell array includes seven row memory lines and seven column memory lines. Column failure counters represent or indicate the number of memory failure in the respective column memory lines. Herein, the row spare lines have priority for memory sparing. Searching for a partial repair solution for allowing the number of column lines without priority where the number of failures is not 0 to be less than 4 (which is the number of column spare lines without priority, is the goal of a memory repairing method according to an embodiment of the present invention. In other words, the aim of memory repairing method is to search for a partial repair solution which can allow the number of non-priority memory lines with memory failure (i.e., non-zero failure) to be 4 or less than the spare line without priority. The number of memory failure in memory lines is indicated by or recorded in the respective failure counters.

Figure 6:
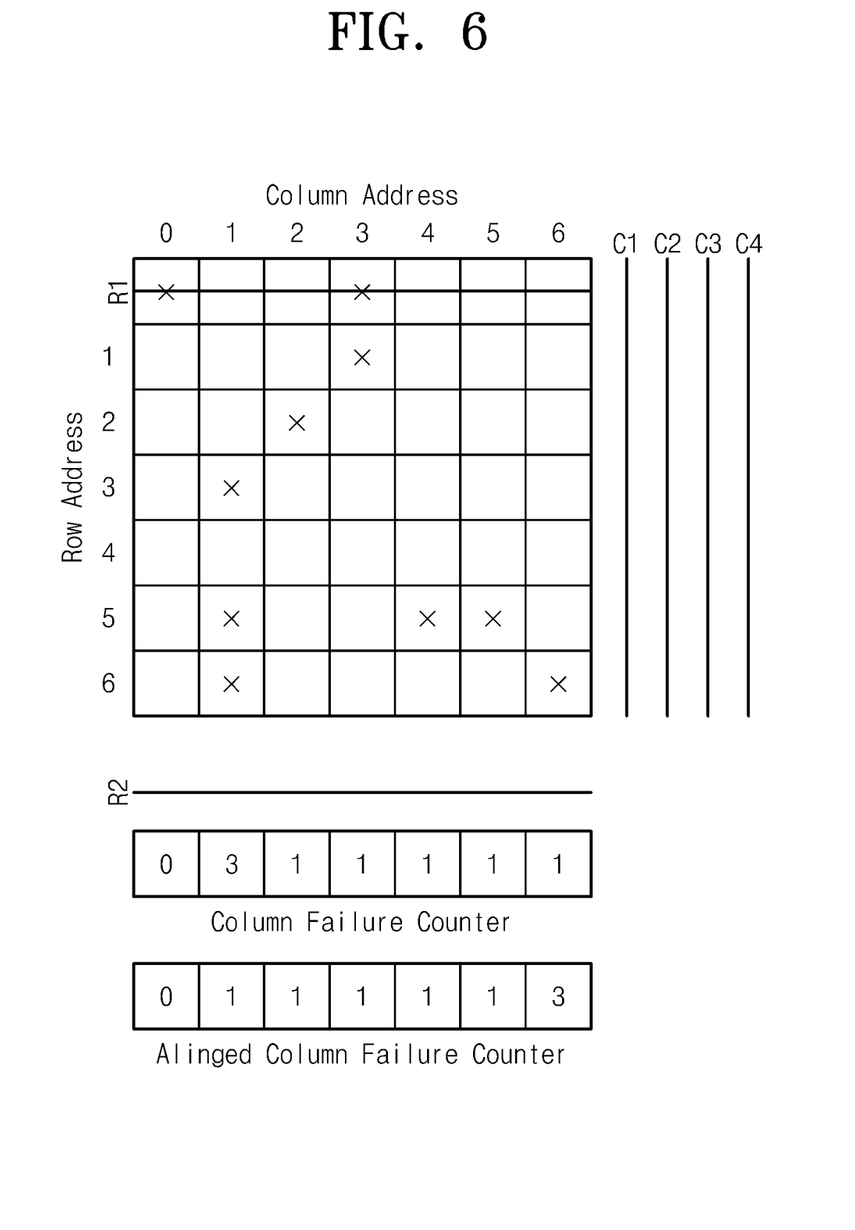

In order to allow the number of failures, that is, 1, of the 0th column at the leftmost among columns included in the group 1 in the aligned column failure counters to be 0, the first row spare line R1 is associated with the 0th row memory line (see FIG. 6).

FIG. 6 is a result view when the first row spare line R1 is associated with the 0th row memory line. After associating the first row spare line R1, the column failure counters is updated. Through the associating the first row spare line R1, the failures (0,0) and (0,3) are repaired, and thus the number of failures, that is, 1, of the 0th column is updated to 0 and the number of failures, that is, 2, of the third column is updated to 1 in the column failure counters. The updated column failure counters are realigned in ascending order and the aligned column failure counters are obtained. Now, since the number of failures of each of the second, third, fourth, and fifth columns is 1, and thus included in the group 1, in order to allow the number of failures, that is, 1, of the second column at the front of group 1 to be 0, a second row spare line R2 is associated with the second column memory line (See FIG. 7).

Figure 7:
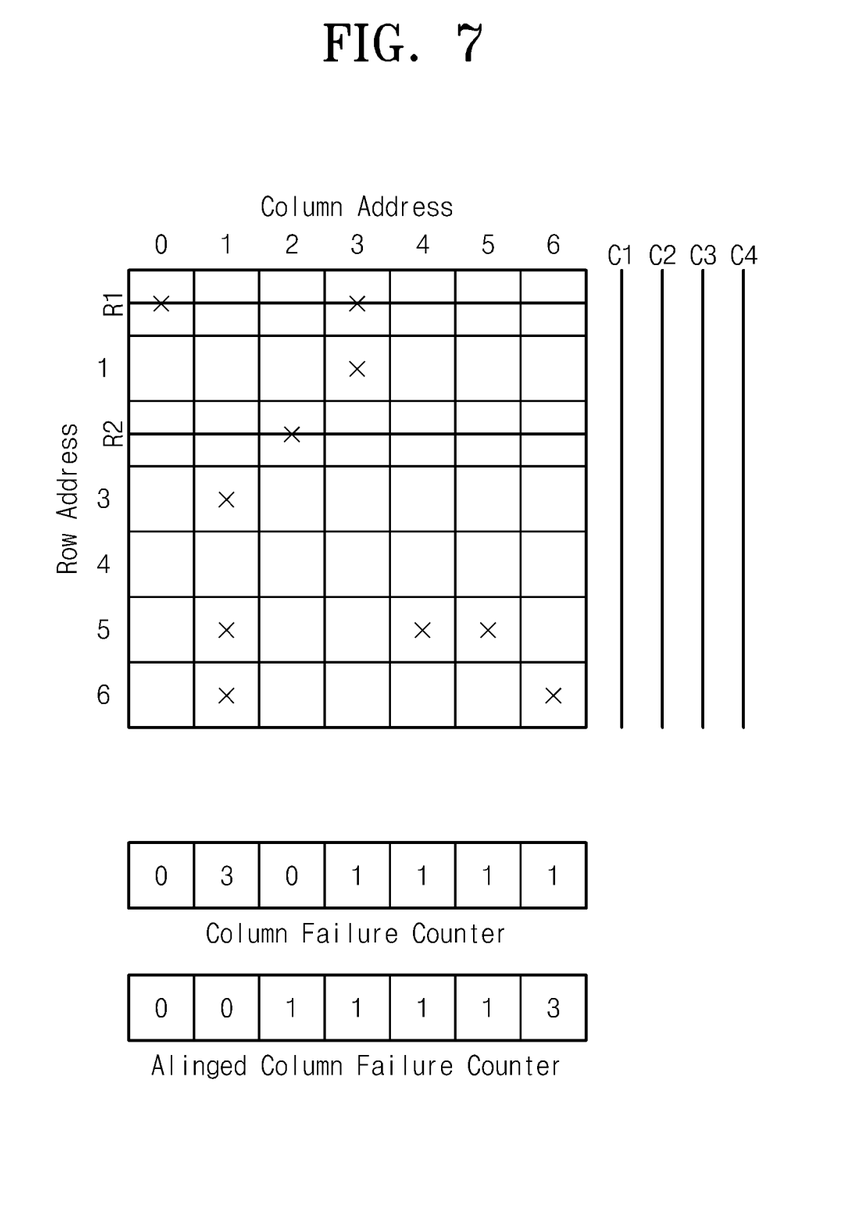

FIG. 7 is a result view when the second row spare line R2 is associated with the second column memory line. After associating the second row spare line R2, the column failure counters are updated. By the associating the second row spare line R2, since the failure (2.2) is repaired, the number of failures, that is, 1, of the second column memory line in the aligned column failure counters is updated to 0. The updated column failure counters are realigned in ascending order and the aligned column failure counters are obtained as shown in FIG. 7 (see bottom). However, the number of columns where the number of failures is not 0 is 5 and the number of column spare lines is 4. Thus, all failures may not be repaired. Accordingly, withdrawal of associating the spare line is performed and then, a new repair solution is searched for.

Figure 8:
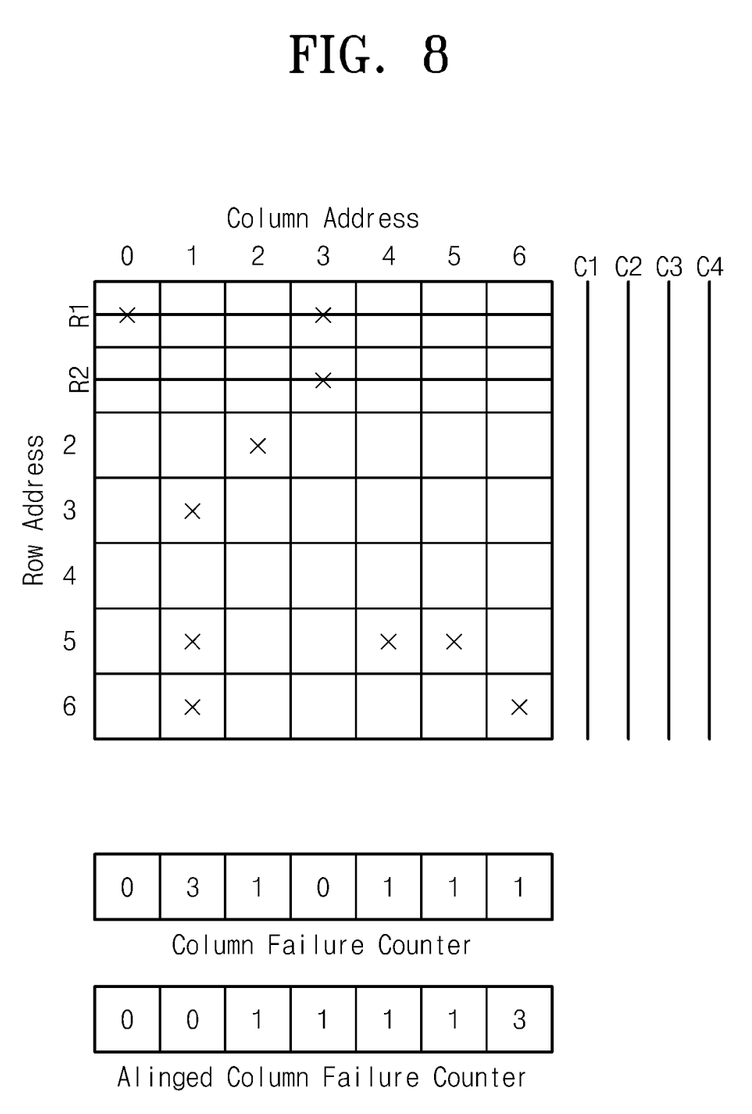

FIG. 8 is a result view when the second row spare line R2 is associated with the first row memory line in order to allow the number of failures, that is, 1, for the third column memory line (second 1 in the aligned column failure counters of FIG. 6) to be 0 after withdrawing the associating the second row spare line R2 with the second row memory line. After re-associating the second row spare line, the column failure counters are updated. By the re-associating the second row spare line R2, the failure (1.3) is repaired and thus the number of failures, that is, 1, of the third column in the column failure counter is updated to 0. The updated column failure counters are realigned in ascending order and the aligned column failure counters are obtained. In this case, like FIG. 7, the number of columns where the number of failures is not 0 is 5 and the number of column spare lines is 4. Thus, all failures may not be repaired by the remaining column spare lines. Accordingly, a further new repair solution is searched for after withdrawing the re-associating.

Figure 9:
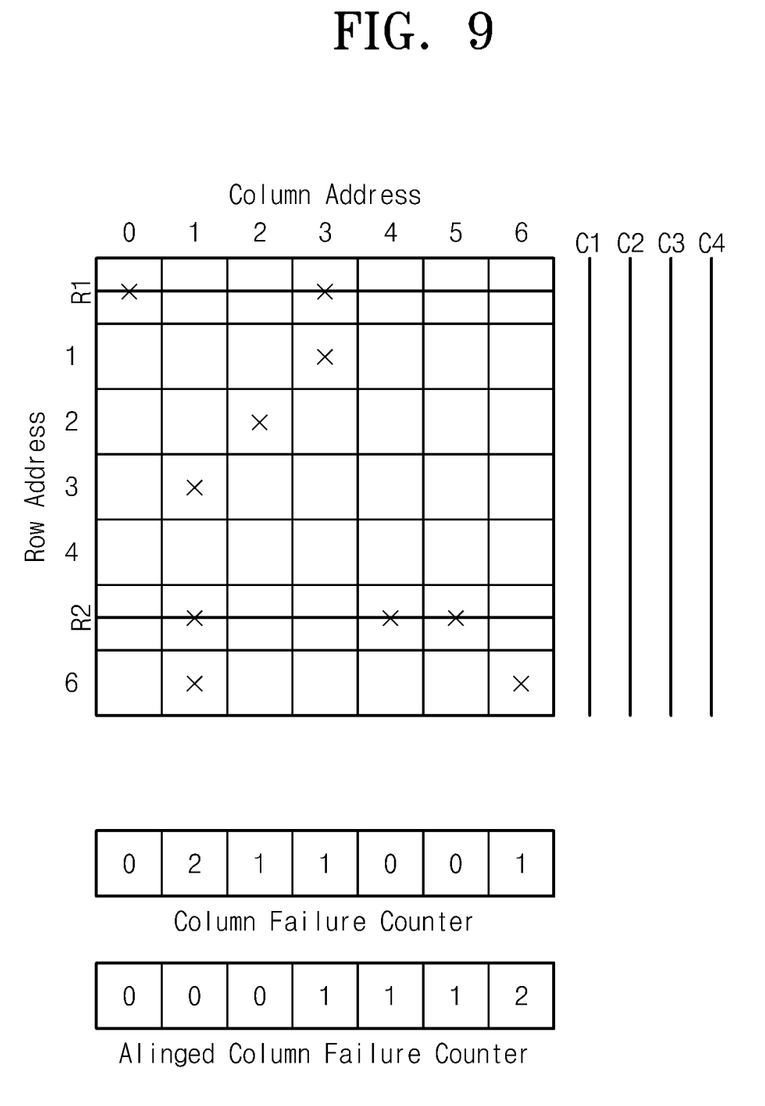

FIG. 9 is a result view when the second row spare line R2 is re-associated with the fifth row memory line in order to allow the number of failures, that is, 1, of the fourth column memory line (third 1 in the column failure counters of FIG. 6) to be 0 after withdrawal of associating the second row spare line R2 with the first row memory line. After re-associating the second row spare line R2, the column failure counters are updated. By the re-associating the second row spare line R2 with fifth row memory line, since the failures (5.1), (5.4), and (5.5) are repaired, the number of failures, that is, 3, of the first column memory line is updated to 2 and the numbers of failures, that is, 1's, of the fourth and fifth column memory lines are updated to 0', respectively in the column failure counters. The updated column failure counters are realigned in ascending order and the aligned column failure counter is obtained. After the re-associating the second row spare line R2, since the number of column memory lines where the number of failures is not 0 is 4, all failures may be repaired by disposing the remaining 4 column spare lines. The current associating the first row spare line R1 and the second row spare line R2 become a partial repair solution.

Figure 10:
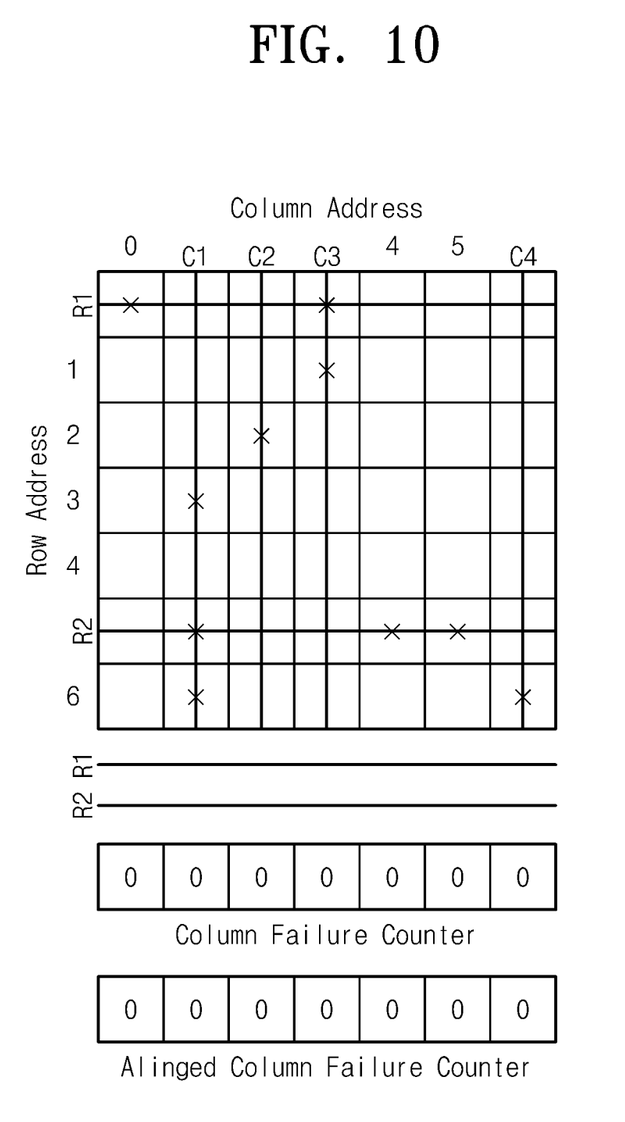

FIG. 10 is a result view when column spare memories C1, C2, C3, and C4 are associated with the first, second, third, and sixth column memory lines, respectively. The failures (3,1) and (6,1) are repaired by C1; the failure (2.2) is repaired by C2; the failure (1,3) is repaired by C3; and the failure (6,6) is repaired by the C4. Accordingly, a current association result may be derived as a partial solution and also, a final repair solution includes associating two row spare lines with the 0th row and the fifth row memory lines, respectively and associating four column spare lines with the first, second, third, and sixth column memory lines, respectively.

Figure 11:
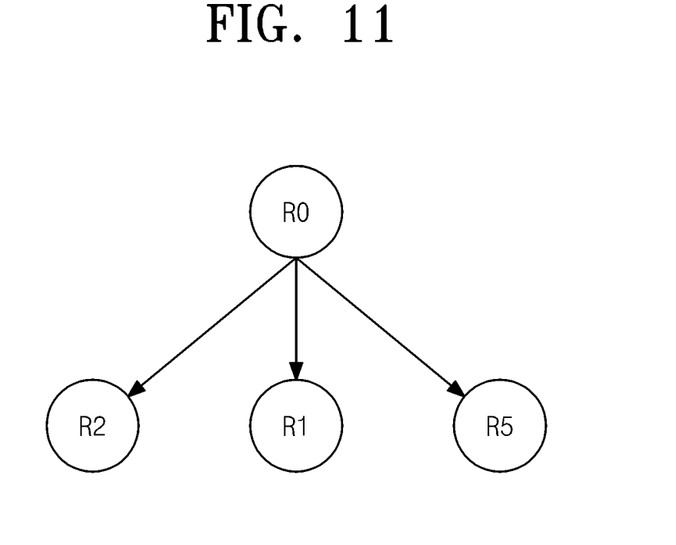

FIG. 11 is a view illustrating a search tree structure used in a memory repairing method according to an embodiment of the present invention. Compare to that the height of a typical tree structure using a complete enumeration survey is (the number of row spare lines+the number of column spare lines), the height of a search tree according to an embodiment of the present invention becomes 2 (because only row spare lines are used). That is, since the present invention depends on the number of spare lines with priority, MIN (the number of row spare lines, the number of column spare lines) becomes the height of a search tree. Accordingly, a memory repairing method according to an embodiment of the present invention may derive a repair solution faster than a memory repair method using a typical search tree.

Figure 12:
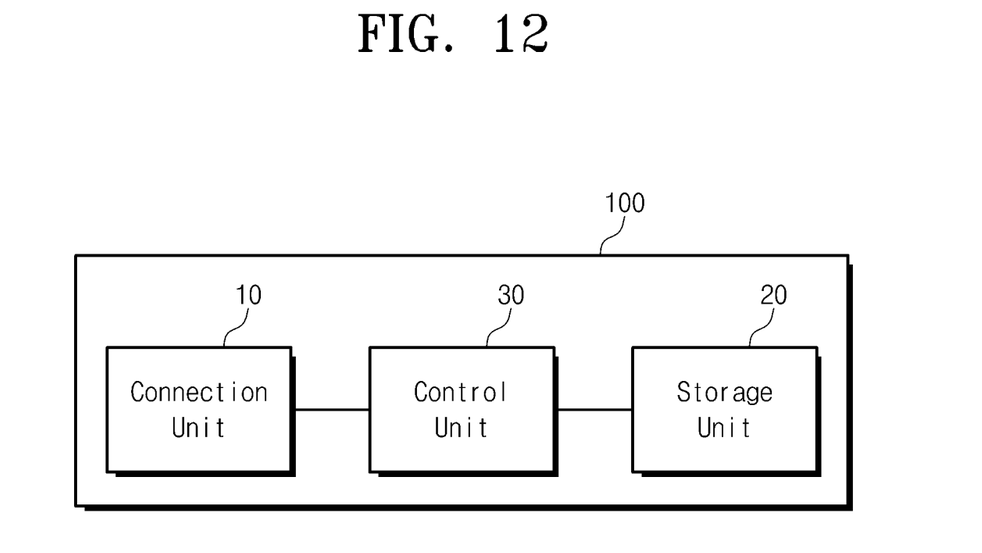
FIG. 12 is a view illustrating a memory repairing device according to an embodiment of the present invention.

FIG. 12 is a view illustrating a memory repairing device according to an embodiment of the present invention. The memory repairing device 100 includes a connection unit 10, a storage unit 20, and a control unit 30.

The association or connection unit 10 may associate or connect the memory repairing device 100 with a memory cell array to be repaired and may then read the bitmap of the memory cell array, the number of row spare lines, the number of column spare lines, and the bitmap address of a failed memory cell from the memory cell array.

The storage unit 20 may store memory cell array information that the connection unit 10 reads. The memory cell array information may include the bitmap of the memory cell array, the number of row spare lines, the number of column spare lines, and the bitmap address of a failed memory cell.

The control unit 30 may control operations of the connection unit 10 and the storage unit 20. Then, the present invention may search for a memory repairing solution by using the information stored in the storage unit 20 and the memory repairing method described with reference to FIGS. 1 to 11. That is, a repair solution may be searched for by using failure counters for respective memory lines without priority and spare lines with priority. If the number of memory lines where the number of failures is not 0 in the failure counters is greater than or equal to the number of spare lines without priority, the repairing solution search is terminated and a final repairing solution may be derived.

A memory repairing method according to an embodiment of the present invention may derive a repair solution in a short time while guaranteeing 100% repair efficiency.

The memory repairing method according to the above-mentioned embodiments may be implemented with a program to be executed on a computer and stored on a computer readable recording medium. The computer readable recording medium includes all kinds of storage devices where data readable by a computer system is stored. Examples of a computer readable recording medium may include ROM, RAM, CD-ROM, a magnetic tape, a floppy disk, and an optical data storage device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. A memory repairing method comprising:
    determining spare lines with priority to be used for repair; and
    searching for a repair solution by using the spare lines with priority and failure counters for spare lines without priority,
    wherein searching for the repair solution comprises:
        associating a spare line with priority with a memory line having at least one failure counted by a failure counter, which outputs the smallest failure number among the failure counters for the spare lines without priority;
        updating the failure counters;
        repeating the associating step and the updating step until all of the spare lines with priority are associated with memory lines;
        terminating a repair solution search when the number of the failure counters which output a non-zero failure number is less than or equal to the number of the spare lines without priority; and
        re-associating at least one of the spare lines with priority if the number of the failure counters which output a non-zero failure number is greater than the number of the spare lines without priority, and wherein the determining the spare lines with priority comprises determining spare lines having a relatively smaller line number among row spare lines and column spare lines.

2. The method of claim 1, wherein associating the spare line with priority comprises:
aligning the failure counters; and
associating the spare line with priority with the memory line having the smallest number of failures in the aligned failure counters.

3. The method of claim 2, wherein aligning the failure counters comprises grouping the memory lines having the same number of failures in the aligned failure counters.

4. A method of repairing a memory cell array where the number of row spare lines is greater than the number of column spare lines, the method comprising:
searching for a repair solution by using the column spare lines and row failure counters, wherein the searching for the repair solution comprises:
aligning the row failure counters;
associating the column spare lines with a column having the smallest number of failures in the aligned row failure counters;
updating the row failure counters; and
repeating the associating step and the updating step until all of the column spare lines are associated with columns;
terminating a repair solution search when the number of the row failure counters, which output a non-zero failure number, is less than or equal to the number of the row spare lines; and
re-associating at least one of the column spare lines if the number of the row failure counters, which output a non-zero failure number, is greater than the number of the row spare lines,
wherein the aligning of the row failure counters comprises grouping rows having the same number of failures in the aligned row failure counters.

5. A method of repairing a memory cell array where the number of column spare lines is greater than the number of row spare lines, the method comprising:
searching for a repair solution by using the row spare lines and column failure counters, wherein searching for the repair solution comprises:
aligning the column failure counters;
associating the row spare lines with a row having the smallest number of failures in the aligned column failure counters;
updating the column failure counters; and
repeating the associating step and the updating step until all of the row spare lines are associated with rows;
terminating a repair solution search when the number of the column failure counters, which output a non-zero failure number, is less than or equal to the number of column spare lines; and
re-associating at least one of the row spare lines if the number of the column failure counters, which output a non-zero failure number, is greater than the number of the column spare lines,
wherein the aligning of the column failure counters comprises grouping columns having the same number of failures in the aligned column failure counters.

6. A memory repairing device comprising:
a connection unit connected to a memory cell array and reading information;
a storage unit storing the read information; and
a control unit repairing a failure of the memory cell array by using the read information,
wherein the control unit searches for a repair solution by using failure counters of lines having a larger value among the number of row spare lines and the number of column spare lines in the memory cell array and spare lines having a smaller value among the number of the row spare lines and the number of the column spare lines, and terminates a repair solution search when the number of lines, of which the number of failures is not 0 in the failure counters, is less than or equal to a larger value among the number or the row spare lines and the number of the column spare lines,
wherein the control unit associates a spare line having a smaller value with a memory line having at least one failure counted by a failure counter, which outputs the smallest failure number among the failure counters of lines having a larger value, updates the failure counters of lines having the larger value, and repeats associating of the spare lines and updating the failure counters until all of the spare lines having a smaller value are associated with memory lines, and
wherein the control unit re-associates at least one of the spare lines having a smaller value if the number of the failure counters, which output a non-zero failure number, is greater than the number of the spare lines having a larger value.

* * * * *